United States Patent
Wei et al.

(10) Patent No.: US 10,283,783 B2
(45) Date of Patent: May 7, 2019

(54) METHOD FORMING A GRAPHENE OXIDE-REDUCED GRAPHENE OXIDE JUNCTION

(71) Applicant: Nokia Technologies Oy, Espoo (FI)

(72) Inventors: Di Wei, Cambridge (GB); Mark Allen, Cambridgeshire (GB)

(73) Assignee: Nokia Technologies Oy, Espoo (FI)

( * ) Notice: Subject to any disclaimer, the term of this patent is extended or adjusted under 35 U.S.C. 154(b) by 161 days.

(21) Appl. No.: 15/521,644

(22) PCT Filed: Oct. 21, 2015

(86) PCT No.: PCT/FI2015/050714
§ 371 (c)(1),
(2) Date: Apr. 25, 2017

(87) PCT Pub. No.: WO2016/066889
PCT Pub. Date: May 6, 2016

(65) Prior Publication Data
US 2017/0250413 A1     Aug. 31, 2017

(30) Foreign Application Priority Data
Oct. 30, 2014   (EP) .................................... 14191045

(51) Int. Cl.
*H01M 6/40*     (2006.01)
*H01L 21/263*     (2006.01)
(Continued)

(52) U.S. Cl.
CPC ............ *H01M 6/40* (2013.01); *H01L 21/263* (2013.01); *H01M 4/0414* (2013.01); *H01M 4/583* (2013.01); *H01M 6/32* (2013.01)

(58) Field of Classification Search
CPC ........... H01M 4/583; H01M 6/32; H01M 6/40
(Continued)

(56) References Cited

U.S. PATENT DOCUMENTS

| 2013/0092904 A1 | 4/2013 | Ushikura .................... 257/40 |
| 2014/0017440 A1 | 1/2014 | Miyamoto .................... 428/98 |

(Continued)

FOREIGN PATENT DOCUMENTS

| JP | 2007250253 A | 9/2007 |
| JP | 2013035739 A | 2/2013 |
| JP | 2013084845 A | 5/2013 |

OTHER PUBLICATIONS

Teoh, Hao Fatt, et al., "Direct laser-enabled graphene oxide-Reduced graphene oxide layered structures with micropatterning", Journal of Applied Physics, American Institute of Physics, US, Sep. 2012, vol. 112, abstract, 1 pg.

*Primary Examiner* — James M Erwin
(74) *Attorney, Agent, or Firm* — Harrington & Smith (57) ABSTRACT

A method including a deposition step comprising depositing a layer of graphene oxide; a deposition step including selectively exposing a region of the deposited graphene oxide layer to electromagnetic radiation to form a region of reduced graphene oxide adjacent to a neighboring region of unexposed graphene oxide, the graphene oxide and adjacent reduced graphene oxide regions forming a junction therebetween to produce a graphene oxide-reduced graphene oxide junction layer; and repeating the deposition and exposure steps for one or more further respective layers of graphene oxide, over an underlying graphene oxide-reduced graphene oxide junction layer, to produce an apparatus in which the respective junctions of the graphene oxide-reduced graphene oxide layers, when considered together, extend in the third dimension.

16 Claims, 5 Drawing Sheets

(51) Int. Cl.
*H01M 4/04* (2006.01)
*H01M 6/32* (2006.01)
*H01M 4/583* (2010.01)

(58) Field of Classification Search
USPC .......................................................... 429/124
See application file for complete search history.

(56) References Cited

U.S. PATENT DOCUMENTS

2014/0120453 A1\* 5/2014 Ajayan ................... C01B 32/23
　　　　　　　　　　　　　　　　　　　　　　　429/482
2014/0284718 A1 9/2014 Lim et al. ..................... 257/347

\* cited by examiner

METHOD FORMING A GRAPHENE OXIDE-REDUCED GRAPHENE OXIDE JUNCTION

TECHNICAL FIELD

The present disclosure relates to the use of graphene oxide, associated methods and apparatus, and in particular concerns a method involving the sequential deposition and exposure of respective overlying graphene oxide layers to electromagnetic radiation to form a graphene oxide-reduced graphene oxide junction which extends in the third dimension. One specific application of the present method is the production of proton batteries, which may form part of an electronic device or module. In this respect, certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs), smartwatches and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop smaller electrical storage cells having a greater storage capacity than existing storage cells for use in modern electronic devices.

The listing or discussion of a prior-published document or any background in this specification should not necessarily be taken as an acknowledgement that the document or background is part of the state of the art or is common general knowledge.

SUMMARY

According to a first aspect, there is provided a method comprising:
  a deposition step comprising depositing a layer of graphene oxide;
  an exposure step comprising selectively exposing a region of the deposited graphene oxide layer to electromagnetic radiation to form a region of reduced graphene oxide adjacent to a neighbouring region of unexposed graphene oxide, the graphene oxide and adjacent reduced graphene oxide regions forming a junction therebetween to produce a graphene oxide-reduced graphene oxide junction layer; and
  repeating the deposition and exposure steps for one or more further respective layers of graphene oxide, over an underlying graphene oxide-reduced graphene oxide junction layer, to produce an apparatus in which the respective junctions of the graphene oxide-reduced graphene oxide layers, when considered together, extend in the third dimension.

Of course, the respective graphene oxide and reduced graphene oxide layers, and thereby the respective graphene oxide-reduced graphene oxide junction layers, will inherently have two dimensions. It will thus be appreciated that the repeating of the deposition and exposure provides for the third dimension of the apparatus.

The deposition and exposure steps may be repeated to provide one or more junctions in the respective layers which overlie a junction in the underlying graphene oxide-reduced graphene oxide junction layer. The deposition and exposure steps may be repeated to provide one or more junctions in the respective layers which do not overlie a junction in the underlying graphene oxide-reduced graphene oxide junction layer.

The deposition and exposure steps may be repeated to provide one or more junctions in the respective layers which are interconnected with a junction in the underlying graphene oxide-reduced graphene oxide junction layer to produce a continuous junction in three dimensions.

Selectively exposing the region of the deposited graphene oxide layer to electromagnetic radiation may comprise:
  forming a mask layer comprising a transmission-allowing region and an adjacent transmission-preventing region, the transmission-allowing region configured to allow transmission of the electromagnetic radiation therethrough, the adjacent transmission-preventing region configured to prevent transmission of the electromagnetic radiation therethrough; and
  exposing the layer of graphene oxide to the electromagnetic radiation through the transmission-allowing region of the mask layer to form a corresponding region of reduced graphene oxide and a neighbouring region of unexposed graphene oxide.

Forming the mask layer may comprise depositing one or more discrete transmission-preventing regions to leave adjacent regions clear to form the adjacent transmission-allowing region.

Forming the mask layer may comprise depositing a continuous sheet comprising one or more transmission-allowing regions and one or more adjoining transmission-preventing regions.

Forming the mask layer may comprise depositing an electromagnetic radiation-blocking material above or below a region of the graphene oxide layer which is not to be exposed to the electromagnetic radiation.

The electromagnetic radiation-blocking material may be deposited on a transparent substrate below the graphene oxide layer, and the graphene oxide layer may be exposed to the electromagnetic radiation transmitted through the transparent substrate in the transmission-allowing region of the mask layer.

The electromagnetic radiation-blocking material may comprise an electrically conducting material which doubles as a charge collector for one or both of the graphene oxide and reduced graphene oxide regions.

The electromagnetic radiation-blocking material may further comprise an electrically insulating material configured to prevent electrical contact between the electrically conducting material and the reduced graphene oxide region of the same layer or a subsequent layer.

Selectively exposing the region of the deposited graphene oxide layer to the electromagnetic radiation may comprise directing a beam of electromagnetic radiation onto a predetermined region of the layer of graphene oxide such that only the predetermined region is exposed to the electromagnetic radiation.

Selectively exposing the region of the deposited graphene oxide layer to the electromagnetic radiation may comprise controlling the intensity of the electromagnetic radiation to control the thickness of the region of reduced graphene oxide and the junction between the graphene oxide and reduced graphene oxide regions.

Selectively exposing the region of the deposited graphene oxide layer to the electromagnetic radiation may comprise exposing the region to one or more of a laser beam and a xenon flash light.

According to a further aspect, there is provided an apparatus comprising a plurality of overlying graphene oxide-reduced graphene oxide junction layers, each graphene oxide-reduced graphene oxide junction layer comprising a region of reduced graphene oxide adjacent to a neighbouring region of graphene oxide, wherein the graphene oxide and adjacent reduced graphene oxide regions of each layer form a junction therebetween, and wherein the plurality of graphene oxide-reduced graphene oxide junction layers overlie one another such that the respective junctions of the layers, when considered together, extend in the third dimension.

The graphene oxide-reduced graphene oxide junction layers may be configured to overlie one another such that the respective junctions are interconnected to form a continuous junction in three dimensions.

The respective junctions may be interconnected to form a three-dimensional space-filling curve.

The reduced graphene oxide region of each graphene oxide-reduced graphene oxide junction layer may form up to one or more of 10%, 20%, 30%, 40% and 50% of the layer.

The width of the reduced graphene oxide region may be less than one or more of 2 mm, 1 mm, 500 µm, 100 µm and 50 µm. The width of the junction between the graphene oxide and reduced graphene oxide regions may be less than one or more of 500 µm, 100 µm, 50 µm, 10 µm and 1 µm.

Each graphene oxide-reduced graphene oxide junction layer may comprise respective charge collectors in electrical contact with the graphene oxide and reduced graphene oxide regions.

The respective charge collectors of consecutive graphene oxide-reduced graphene oxide layers may be horizontally offset from one another.

The charge collectors may comprise one or more of a metal, an alloy, gold, silver and copper.

The apparatus may comprise a substrate configured to support the plurality of overlying graphene oxide-reduced graphene oxide junction layers.

The apparatus may be one or more of an electronic device, a portable electronic device, a portable telecommunications device, a mobile phone, a personal digital assistant, a tablet, a phablet, a laptop computer, a desktop computer, a smartphone, a smartwatch, smart eyewear, a proton battery, and a module for one or more of the same.

The steps of any method disclosed herein do not have to be performed in the exact order disclosed, unless explicitly stated or understood by the skilled person.

Throughout the present specification, descriptors relating to relative orientation and position, such as "top", "bottom", "upper", "lower", "above" and "below", as well as any adjective and adverb derivatives thereof, are used in the sense of the orientation of the apparatus as presented in the drawings. However, such descriptors are not intended to be in any way limiting to an intended use of the described or claimed invention.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which.

DESCRIPTION OF SPECIFIC ASPECTS/EMBODIMENTS

Electrical energy storage is an important consideration for portable electronic devices. Proton batteries are currently being developed for this purpose. The energy generation mechanism of one type of proton battery involves the degradation of a graphene oxide-reduced graphene oxide junction when in contact with water. The water may be contained within the battery or it may come from the surrounding environment (e.g. in the form of air humidity).

Figure 1A:
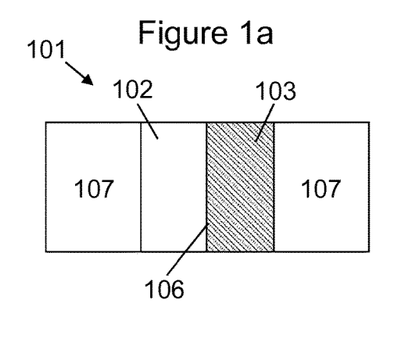
FIGS. 1a-1b illustrate schematically one example of a printed proton battery.
Figure 1B:
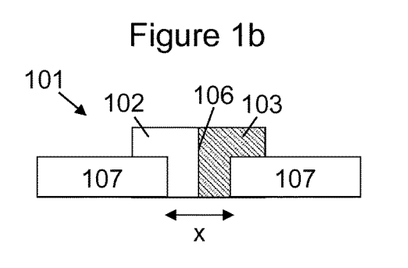

FIGS. 1a and 1b show a printed graphene oxide-based proton battery 101 in plan view and cross-section, respectively. The battery 101 comprises a first electrode 102 formed from graphene oxide and a second electrode 103 formed from reduced graphene oxide. The first 102 and second 103 electrodes are deposited such that they (at least partly) overlie respective charge collectors 107 and form a junction 106 with one another at an interface therebetween. To avoid short circuiting the device, the first 102 and second 103 electrode materials should not be in contact with the charge collector 107 of the opposite electrode. In order to achieve this, the charge collectors 107 are separated from one another by a predetermined distance "x" (typically no less than 2 mm), which is dictated by the printing resolution of the deposition tool used to print the graphene oxide 102 and reduced graphene oxide 103, and the fluidity of the graphene oxide inks used to form the active electrode materials 102, 103. A relatively large electrode spacing can increase the footprint of the apparatus 101 and thus reduce its electrical storage density.

There will now be described a method and associated apparatus that may provide a solution to this issue.

Figure 2:
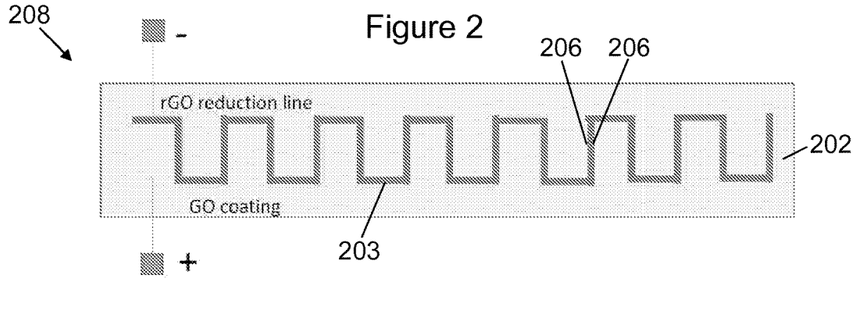
FIG. 2 illustrates schematically the formation of a graphene oxide-reduced graphene oxide junction by exposing a layer of graphene oxide to electromagnetic radiation.

FIG. 2 illustrates a method (in plan-view) of forming an apparatus such as a proton battery. The method comprises depositing a layer of graphene oxide 202, and selectively exposing a region of the deposited graphene oxide layer 202 to electromagnetic radiation to form a region of reduced graphene oxide 203 adjacent to a neighbouring region of unexposed graphene oxide 202. Depending on the deposition technique, the layer of graphene oxide 202 may need to be cured before it is exposed to the electromagnetic radiation. Reduction of the graphene oxide 202 may be achieved by exposing the region to one or more of a laser beam and a xenon flash light (for example). The reduced graphene oxide 203 is detectable by a characteristic darkening of the graphene oxide 202 in the exposed region and a corresponding decrease in its electrical resistance. Furthermore, by controlling the intensity of the electromagnetic radiation, it is possible to control the thickness (or depth) of the reduced graphene oxide 203.

The graphene oxide 202 and adjacent reduced graphene oxide 203 regions form a junction 206 therebetween to produce a graphene oxide-reduced graphene oxide junction layer 208. An technical effect of using electromagnetic radiation to form the junction 206 (for example, instead of printing techniques) is that the respective sizes of the graphene oxide 202 and reduced graphene oxide 203 regions can be more carefully controlled. This is partly because of the higher resolutions achievable with beams of electromagnetic radiation, and partly because there is no need for printable inks which can bleed into adjacent regions. This aspect can allow close charge collector spacing and can enable fine graphene oxide-reduced graphene oxide junctions 206 to be produced. As illustrated in FIG. 2, it also allows the formation of more complicated junction patterns 206, which can be used to increase the electrical storage density even further due to a greater interfacial area between the graphene oxide 202 and reduced graphene oxide 203 regions.

FIGS. 3a-f show a variety of different two-dimensional space-filling or Hilbert curves (in plan-view) which can be formed by the selective exposure of a graphene oxide layer 302 to electromagnetic radiation, the interfacial area increasing from one pattern to the next. In practice, the reduced graphene oxide region 303 of the graphene oxide layer 302 may form up to one or more of 10%, 20%, 30%, 40% and 50% of the layer. Furthermore, the width of the reduced graphene oxide region 303 may be less than one or more of 2 mm, 1 mm, 500 μm, 100 μm and 50 μm, and the junction between the graphene oxide 302 and reduced graphene oxide 303 regions may be less than one or more of 500 μm, 100 μm, 50 μm, 10 μm and 1 μm.

Figure 3:
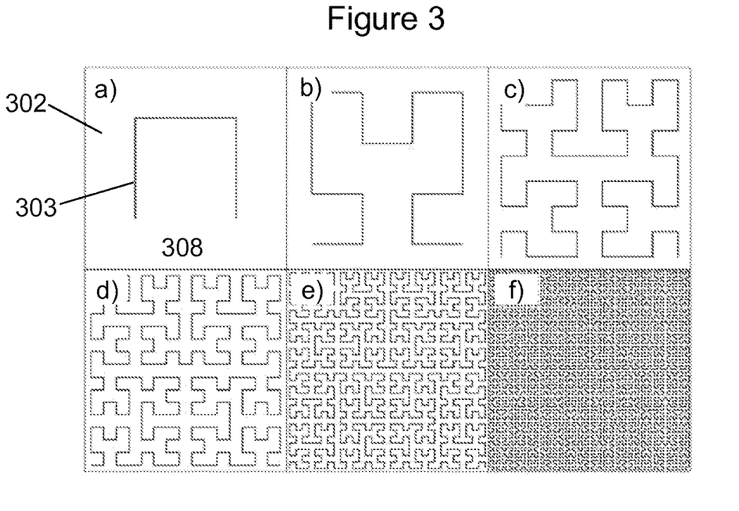
FIG. 3 illustrates schematically graphene oxide-reduced graphene oxide junctions which extend in two-dimensions to form a variety of different two-dimensional space-filling curves.

The deposition and exposure steps mentioned above can be repeated for one or more further layers of graphene oxide 302 over an underlying graphene oxide-reduced graphene oxide junction layer 308. This can be used to produce an apparatus in which the respective junctions of the graphene oxide-reduced graphene oxide layers 308, when considered together, extend in the third dimension. By extending the junction in the third dimension, the interfacial area between the graphene oxide 302 and reduced graphene oxide 303 regions can be large, which can enable the electrical storage density of a proton battery formed in this way to be large.

Figure 4:
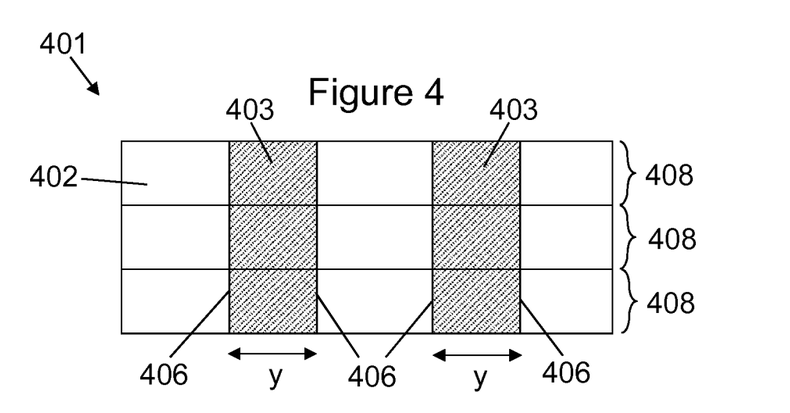
FIG. 4 illustrates schematically one example of the present apparatus.

FIG. 4 shows one example of an apparatus 401 formed in this way (in cross-section). As can be seen, the apparatus 401 comprises a plurality of overlying graphene oxide-reduced graphene oxide junction layers 408, each comprising a region of reduced graphene oxide 403 adjacent to a neighbouring region of graphene oxide 402 to form a junction 406 therebetween. In addition, the plurality of graphene oxide-reduced graphene oxide junction layers 408 overlie one another such that the respective junctions 406 of the layers 408, when considered together, extend in the third dimension. The width (y) of each reduced graphene oxide region 403 is indicated by the double-ended arrow and, as mentioned above, may be as narrow as 1 μm.

As illustrated in FIG. 4, the deposition and exposure steps may be performed to provide one or more junctions 406/reduced graphene oxide regions 403 in the respective layers 408 which overlie a junction 406/reduced graphene oxide region 403 in the underlying layer 408. Additionally or alternatively, the deposition and exposure steps may be performed to provide one or more junctions 406/reduced graphene oxide regions 403 in the respective layers 408 which are interconnected with a junction/reduced graphene oxide region in the underlying layer to produce a continuous junction 406/reduced graphene oxide region 403 in three dimensions.

Figure 5:
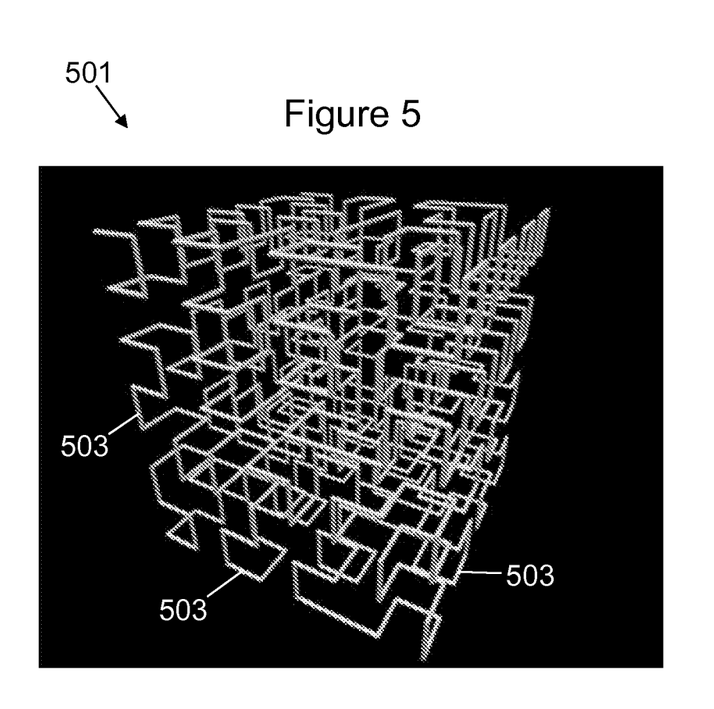
FIG. 5 illustrates schematically a graphene oxide-reduced graphene oxide junction which extends in three dimensions to form a three-dimensional space-filling curve.

FIG. 5 shows another example of an apparatus 501 (perspective view) in which the junctions/reduced graphene oxide regions 503 are interconnected to form a continuous junction/reduced graphene oxide region 503 in three dimensions. In this example, the respective junctions/reduced graphene oxide regions 503 are interconnected to form a three-dimensional space-filling or Hilbert curve.

There are a number of different ways in which a region of the graphene oxide layer can be selectively exposed to electromagnetic radiation. One method involves directing a beam of electromagnetic radiation onto a predetermined region of the layer of graphene oxide such that only the predetermined region is exposed to the electromagnetic radiation. This can be achieved in practice by focusing or collimating a beam of electromagnetic radiation to form a probe, and moving the in-plane position of the probe on the graphene oxide layer to the desired region. In some cases, this may require switching the beam off (or blanking the beam) during movement to the desired region so as not to unintentionally expose additional regions of the graphene oxide layer.

Another method involves the use of a mask layer to expose selected regions of the graphene oxide layer whilst leaving other regions completely or substantially intact. This approach comprises forming a mask layer comprising a transmission-allowing region and an adjacent transmission-preventing region, the transmission-allowing region configured to allow transmission of the electromagnetic radiation therethrough, the adjacent transmission-preventing region configured to prevent transmission of the electromagnetic radiation therethrough. The layer of graphene oxide is then exposed to the electromagnetic radiation through the transmission-allowing region of the mask layer to form a corresponding region of reduced graphene oxide and a neighbouring region of unexposed graphene oxide.

Forming the mask layer may comprise depositing a continuous sheet comprising one or more transmission-allowing regions and one or more adjoining transmission-preventing regions. Alternatively, forming the mask layer may comprise depositing one or more discrete transmission-preventing regions to leave adjacent regions clear to form the adjacent transmission-allowing regions. Depending on the relative positions of the illumination source and the graphene oxide layer, the mask may be located above or below the graphene oxide.

FIGS. 6a-6d shows one method (in cross-section) of forming the present apparatus using a mask layer comprising discrete transmission-preventing regions. In this example, an electromagnetic radiation-blocking material 609 is deposited onto a transparent supporting substrate 610 (FIG. 6a) followed by a layer of graphene oxide 602 (FIG. 6b). The electromagnetic radiation-blocking material 609 is deposited below a region of the graphene oxide layer 602 which is not to be exposed to the electromagnetic radiation 611. Once the layer of graphene oxide 602 has been deposited (FIG. 6b), the underside of the transparent substrate 610 is illuminated by the electromagnetic radiation 611 (e.g. as parallel rays) to expose the graphene oxide layer 602 to the electromagnetic radiation 611 transmitted through the transparent substrate 610 in the transmission-allowing regions of the mask layer (FIG. 6c). In this way, the graphene oxide 603 above the transmission-allowing regions of the mask layer are reduced, and the graphene oxide 602 above the transmission-preventing regions (i.e. above the electromagnetic radiation-blocking material 609) is left completely or substantially intact.

In this example, the electromagnetic radiation blocking material 609 comprises an electrically conducting material 607a which doubles as a charge collector for the graphene oxide region 602. The charge collector 607a is in electrical contact with the graphene oxide 602 and is configured to provide an electrical path between the graphene oxide 602 and an external circuit (not shown). The electrically conducting material 607a may comprise one or more of a metal, an alloy, gold, silver and copper. The electromagnetic radiation blocking material 609 further comprises an electrically insulating material 612 configured to prevent electrical contact between the electrically conducting material 607a and the reduced graphene oxide region 603 of the same layer. This ensures that the charge collector 607a only collects charge from the unexposed graphene oxide 602, and can be achieved by depositing the electrically insulating material 612 between the illumination source and the electrically conducting material 607a such that the electrically insulating material 612 has a greater in-plane area (or footprint) than the electrically conducting material 607a. In this way, the lateral edges of the charge collector 607a is spaced from the region of reduced graphene oxide 603 by the unexposed graphene oxide 602.

Once the graphene oxide layer 602 has been exposed to the electromagnetic radiation 611 to form a graphene oxide-reduced graphene oxide junction layer 608, an electrically conducting material 607b is deposited onto the reduced graphene oxide 603 region to form a charge collector for the reduced graphene oxide 603 (FIG. 6d). The charge collector 607b provides an electrical path between the reduced graphene oxide 603 and the external circuit (not shown). The charge collectors 607a,b of the respective graphene oxide 602 and reduced graphene oxide 603 regions therefore allow any potential difference generated at the graphene oxide-reduced graphene oxide junction 606 to power the external circuit.

The steps shown in FIGS. 6a-6d are then repeated (not shown) to form a multilayer apparatus in which the junction 606 extends in the third dimension. In this example, however, the electromagnetic radiation-blocking material 609 of the lower layers will prevent exposure of the corresponding regions of the overlying layers. As a result, the electromagnetic radiation-blocking material 609 of each layer would typically be deposited at the same lateral (horizontal) position, otherwise the region 603 of the overlying layers exposed to the electromagnetic radiation 611 would be smaller than the region 603 of the lower layers exposed to the electromagnetic radiation 611. As a result, the junctions 606 of the respective layers will be interconnected to form a continuous junction in three dimensions.

Figure 7:
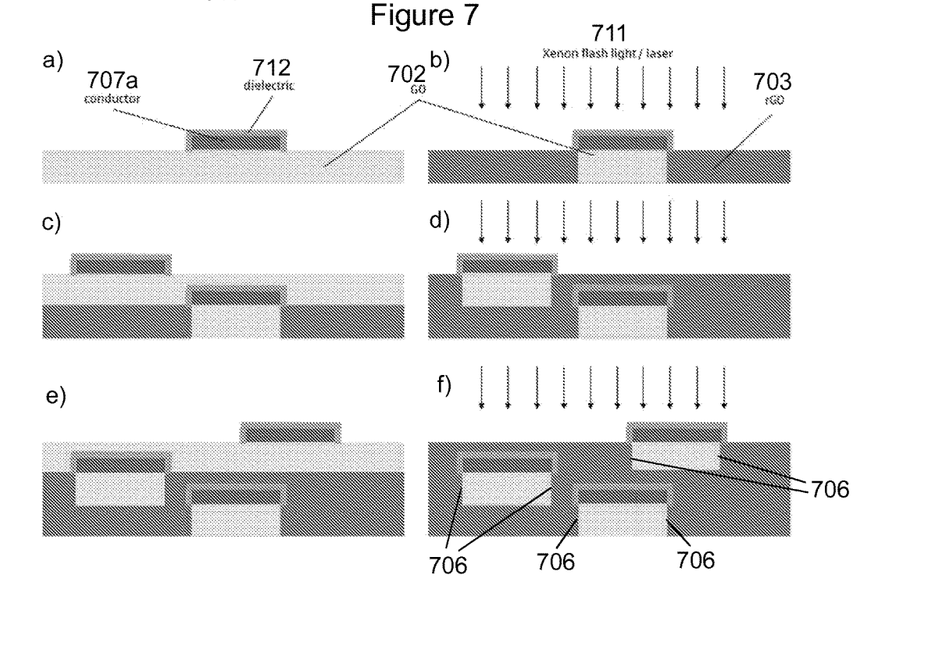
FIGS. 7a-7f illustrate schematically another method of producing the present apparatus.

FIG. 7 shows another method (in cross-section) of forming the present apparatus using a mask layer comprising discrete transmission-preventing regions. In this example, an electrically conducting material 707a is deposited onto a region of the graphene oxide layer 702 to form a charge collector for the graphene oxide 702, and a layer of electrically insulating material 712 is then deposited onto the electrically conducting material 707a such that it coats the upper surface and lateral edges of the electrically conducting material 707a (FIG. 7a). The graphene oxide layer 702 is then illuminated by the electromagnetic radiation 711 from above causing exposure (and thus reduction) of the graphene oxide regions 703 which are not covered by the electrically conducting 707a or electrically insulating 712 materials (FIG. 7b). The regions 703 of the graphene oxide layer which are covered by the electrically conducting 707a and electrically insulating 712 materials, on the other hand, are left completely or substantially intact.

As shown in FIGS. 7c-7f, the deposition and exposure steps are then repeated for one or more further layers of graphene oxide 702. In this example, the electrically insulating material 712 serves to prevent electrical contact between the electrically conducting material 707a and the reduced graphene oxide region 703 of the same and subsequent layer. Furthermore, the respective charge collectors formed by the electrically conducting material 707a are laterally offset from one another. This is more achievable with this method because each graphene oxide layer 702 is illuminated from above, and thus, its exposure is unaffected by the underlying layers. The lateral offset of the charge collectors 707a results in an apparatus in which the graphene oxide-reduced graphene oxide junctions 706 of the respective layers do not overlie one another, which may provide greater design freedom.

Figure 6:
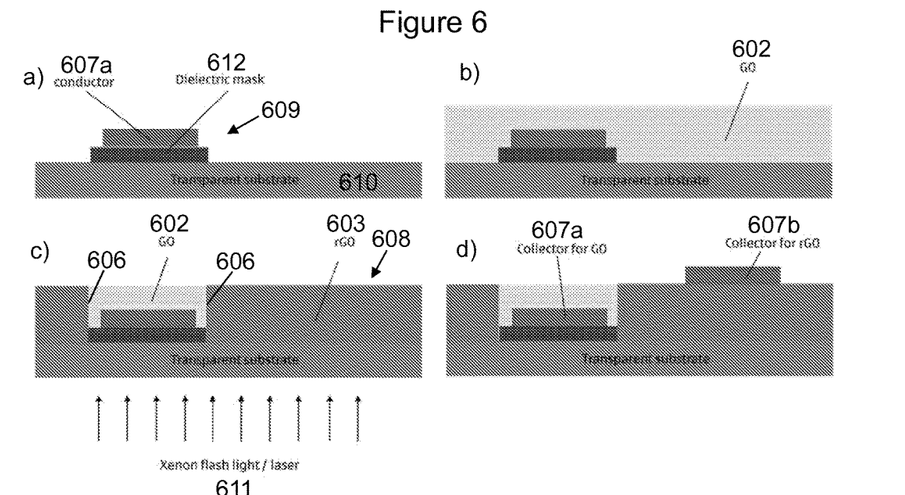
FIGS. 6a-6d illustrate schematically one method of producing the present apparatus.

The charge collectors 707a shown in FIG. 7 are configured to provide an electrical path between the graphene oxide region 702 and an external circuit (not shown), but there are no charge collectors for the reduced graphene oxide region 703. As shown in FIG. 6, this may be addressed by depositing electrically conducting material onto the reduced graphene oxide region 703 of each layer after exposure to the electromagnetic radiation 711 but before deposition of the subsequent graphene oxide layer 702.

Figure 8:
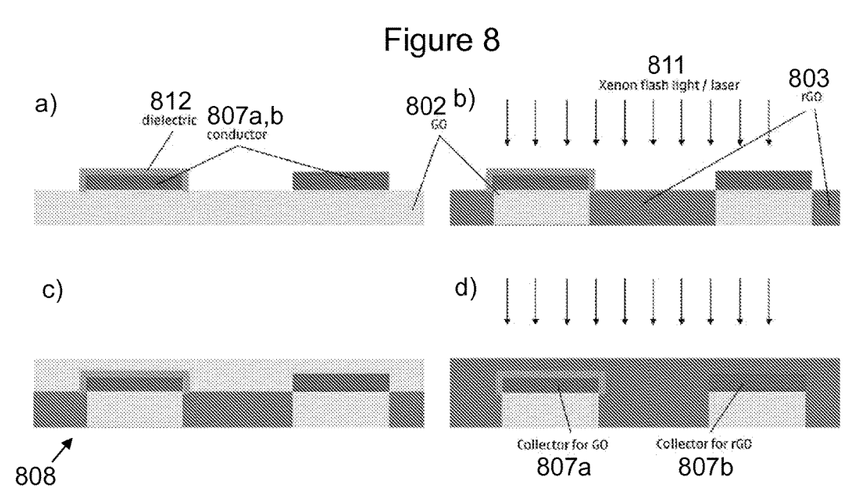
FIGS. 8a-8d illustrate schematically another method of producing the present apparatus.

FIG. 8 shows another method (in cross-section) of forming the present apparatus using a mask layer comprising discrete transmission-preventing regions. Unlike the method shown in FIG. 7, the charge collectors 807a of the graphene oxide regions 802 are formed simultaneously with the charge collectors 807b of the reduced graphene oxide regions 803. This efficiency is achieved by depositing a first electrically conducting material 807a onto one region of the graphene oxide layer 802, and depositing a second electrically conducting material 807b (which may be the same material as the first electrically conducting material 807a or a different material) onto another region of the graphene oxide layer 802 (FIG. 8a). A layer of electrically insulating material 812 is then deposited onto the first electrically conducting material 807a such that it coats the upper surface and lateral edges of the first electrically conducting material 807a. After deposition of the electrically insulating material 812, the graphene oxide layer 802 is illuminated by the electromagnetic radiation 811 from above causing exposure (and thus reduction) of the graphene oxide regions 803 which are not covered by the electrically conducting 807a,b or electrically insulating 812 materials (FIG. 8b). As before, the regions 802 of the graphene oxide layer which are covered by the electrically conducting 807a,b and electrically insulating 812 materials, on the other hand, are left completely or substantially intact.

A further layer of graphene oxide 802 is then deposited on top of the existing graphene oxide-reduced graphene oxide junction layer 808 (FIG. 8c). After deposition, the graphene oxide layer 802 is then illuminated by the electromagnetic radiation 811 which causes exposure (and thus reduction) of the complete layer 802 (FIG. 8d). In this way, the charge collector formed by the first electrically conducting material 807a is in electrical contact 802 with the graphene oxide, but is electrically insulated from the reduced graphene oxide 803 by the electrically insulating material 812. In addition, the charge collector formed by the second electrically conducting material 807b is in electrical contact with the reduced graphene oxide 803 as well as the region of unexposed graphene oxide 802 located directly below the second electrically conducting material 807b. In this scenario, the charge collector formed by the second electrically conducting material 807b will collect more charge from the reduced graphene oxide 803 than it will from the unexposed graphene oxide 802 because the unexposed graphene oxide 802 is more electrically insulating.

As per the methods described with reference to FIGS. 6 and 7, the deposition and exposure steps of FIG. 8 may be repeated for one or more further layers of graphene oxide. In addition, the graphene oxide-reduced graphene oxide junctions of the respective layers may or may not be laterally offset from one another.

Figure 9:
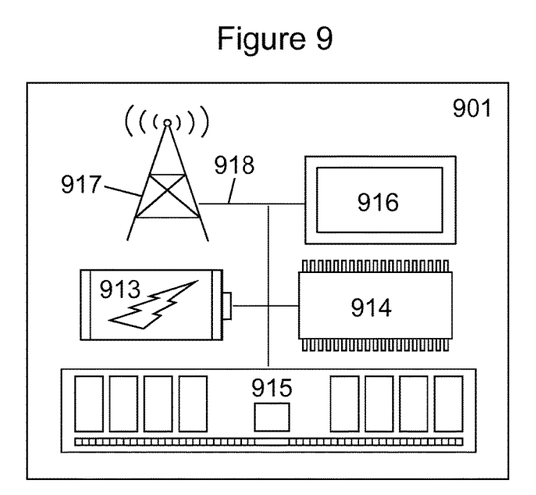
FIG. 9 illustrates schematically another example of the present apparatus.

FIG. 9 shows another example of the present apparatus 901. In this example, the apparatus 901 comprises the graphene oxide-reduced graphene oxide junction layers and associated charge collectors described previously (shown in FIG. 9 as a proton battery 913), a processor 914, a storage medium 915, an electronic display 916 and a transceiver 917, which are electrically connected to one another by a data bus 918. The apparatus 901 may be one or more of an electronic device, a portable electronic device, a portable telecommunications device, a mobile phone, a personal digital assistant, a tablet, a phablet, a laptop computer, a desktop computer, a smartphone, a smartwatch, smart eyewear, and a module for one or more of the same.

The proton battery 913 is configured to provide electrical power to the other components to enable their functionality. In this respect, the other components may be considered to be the external circuit referred to previously. The electronic display 916 is configured to display content stored on the apparatus 901 (e.g. stored on the storage medium 915), and the transceiver 917 is configured to transmit and/or receive data to/from one or more other devices via a wired or wireless connection.

The processor 914 is configured for general operation of the apparatus 901 by providing signalling to, and receiving signalling from, the other components to manage their operation. The storage medium 915 is configured to store computer code configured to perform, control or enable operation of the apparatus 901. The storage medium 915 may also be configured to store settings for the other components. The processor 914 may access the storage medium 915 to retrieve the component settings in order to manage the operation of the other components.

The processor 914 may be a microprocessor, including an Application Specific Integrated Circuit (ASIC). The storage medium 915 may be a temporary storage medium such as a volatile random access memory. On the other hand, the storage medium 915 may be a permanent storage medium such as a hard disk drive, a flash memory, or a non-volatile random access memory.

Figure 10:
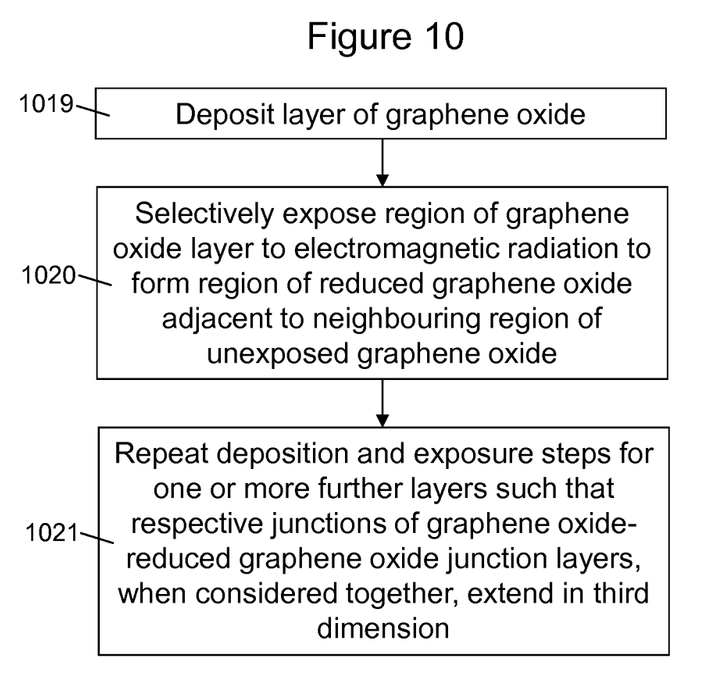
FIG. 10 illustrates schematically the general method of producing the present apparatus.

FIG. 10 shows the main steps 1019-1021 of a method of making the apparatus described herein. The method generally comprises: depositing a layer of graphene oxide 1019; selectively exposing a region of the graphene oxide layer to electromagnetic radiation to form a region of reduced graphene oxide adjacent to a neighbouring region of unexposed graphene oxide 1020; and repeating the deposition and exposure steps for one or more further layers such that the respective junctions of the graphene oxide-reduced graphene oxide junctions layers, when considered together, extend in the third dimension 1021.

Deposition of the various materials described herein may be performed using a variety of different fabrication techniques. For example, the graphene oxide may be deposited as a graphene oxide solution using spray coating, drop casting, spin coating or inkjet printing; the electrically conducting material used to form the charge collectors may be deposited lithographically using inkjet, screen, stencil or flexographic printing, evaporation or sputtering; and the electrically insulating material used to coat the charge collectors may be deposited by oxidation of the electrically conducting material or by chemical vapour deposition.

Figure 11:
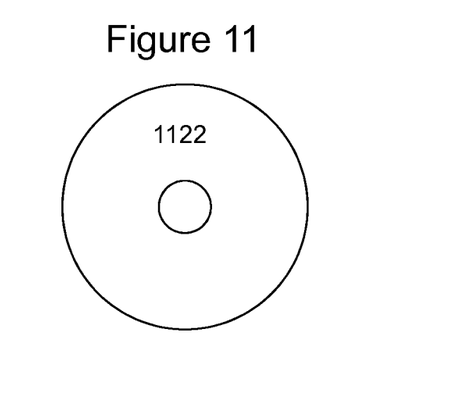
FIG. 11 illustrates schematically a computer-readable medium comprising a computer program configured to perform, control or enable one or more of the method steps of FIG. 10.

FIG. 11 illustrates schematically a computer/processor readable medium 1122 providing a computer program according to one embodiment. The computer program may comprise computer code configured to perform, control or enable one or more of the method steps 1019-1021 of FIG. 10. In this example, the computer/processor readable medium 1122 is a disc such as a digital versatile disc (DVD) or a compact disc (CD). In other embodiments, the computer/processor readable medium 1122 may be any medium that has been programmed in such a way as to carry out an inventive function. The computer/processor readable medium 1122 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features.

In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A method comprising:
   a deposition step comprising depositing a layer of graphene oxide;
   an exposure step comprising selectively exposing a region of the deposited graphene oxide layer to electromagnetic radiation to form a region of reduced graphene oxide adjacent to a neighbouring region of unexposed graphene oxide, the graphene oxide and adjacent reduced graphene oxide regions forming a junction therebetween to produce a graphene oxide-reduced graphene oxide junction layer; and
   repeating the deposition and exposure steps for one or more further respective layers of graphene oxide, over an underlying graphene oxide-reduced graphene oxide junction layer, to produce an apparatus in which the respective junctions of the graphene oxide-reduced graphene oxide layers, when considered together, extend in the third dimension.

2. The method of claim 1, wherein the deposition and exposure steps are repeated to provide one or more junctions in the respective layers which overlie a junction in the underlying graphene oxide-reduced graphene oxide junction layer.

3. The method of claim 1, wherein the deposition and exposure steps are repeated to provide one or more junctions in the respective layers which are interconnected with a junction in the underlying graphene oxide-reduced graphene oxide junction layer to produce a continuous junction in three dimensions.

4. The method of claim 1, wherein selectively exposing the region of the deposited graphene oxide layer to electromagnetic radiation comprises:

forming a mask layer comprising a transmission-allowing region and an adjacent transmission-preventing region, the transmission-allowing region configured to allow transmission of the electromagnetic radiation therethrough, the adjacent transmission-preventing region configured to prevent transmission of the electromagnetic radiation therethrough; and exposing the layer of graphene oxide to the electromagnetic radiation through the transmission-allowing region of the mask layer to form a corresponding region of reduced graphene oxide and a neighbouring region of unexposed graphene oxide.

5. The method of claim 4, wherein forming the mask layer comprises depositing one or more discrete transmission-preventing regions to leave adjacent regions clear to form the adjacent transmission-allowing region.

6. The method of claim 4, wherein forming the mask layer comprises depositing a continuous sheet comprising one or more transmission-allowing regions and one or more adjoining transmission-preventing regions.

7. The method of claim 4, wherein forming the mask layer comprises depositing an electromagnetic radiation-blocking material above or below a region of the graphene oxide layer which is not to be exposed to the electromagnetic radiation.

8. The method of claim 7, wherein the electromagnetic radiation-blocking material is deposited on a transparent substrate below the graphene oxide layer, and wherein the graphene oxide layer is exposed to the electromagnetic radiation transmitted through the transparent substrate in the transmission-allowing region of the mask layer.

9. The method of claim 7, wherein the electromagnetic radiation-blocking material comprises an electrically conducting material which doubles as a charge collector for one or both of the graphene oxide and reduced graphene oxide regions.

10. The method of claim 9, wherein the electromagnetic radiation-blocking material further comprises an electrically insulating material configured to prevent electrical contact between the electrically conducting material and the reduced graphene oxide region of the same layer or a subsequent layer.

11. The method of claim 1, wherein selectively exposing the region of the deposited graphene oxide layer to the electromagnetic radiation comprises directing a beam of electromagnetic radiation onto a predetermined region of the layer of graphene oxide such that only the predetermined region is exposed to the electromagnetic radiation.

12. The method of claim 1, wherein selectively exposing the region of the deposited graphene oxide layer to the electromagnetic radiation comprises controlling the intensity of the electromagnetic radiation to control the thickness of the region of reduced graphene oxide and the junction between the graphene oxide and reduced graphene oxide regions.

13. The method of claim 1, wherein selectively exposing the region of the deposited graphene oxide layer to the electromagnetic radiation comprises exposing the region to a laser beam.

14. The method of claim 1, wherein selectively exposing the region of the deposited graphene oxide layer to the electromagnetic radiation comprises exposing the region to a xenon flash light.

15. An apparatus comprising a plurality of overlying graphene oxide-reduced graphene oxide junction layers, each graphene oxide-reduced graphene oxide junction layer comprising a region of reduced graphene oxide adjacent to a neighbouring region of graphene oxide, wherein the graphene oxide and adjacent reduced graphene oxide regions of each layer form a junction therebetween, and wherein the plurality of graphene oxide-reduced graphene oxide junction layers overlie one another such that the respective junctions of the layers, when considered together, extend in the third dimension.

16. A computer program comprising computer code configured to perform the method of claim 1.

* * * * *